United States Patent
Naruse et al.

(10) Patent No.: US 10,654,247 B2
(45) Date of Patent: May 19, 2020

(54) ELECTROMAGNETIC WAVE SUPPRESSION SHEET

(71) Applicant: DUPONT TEIJIN ADVANCED PAPERS (JAPAN), LTD., Tokyo (JP)

(72) Inventors: Shinji Naruse, Tokyo (JP); Tatsushi Fujimori, Tokyo (JP); Koichi Ukigaya, Tokyo (JP); Chihiro Kondo, Tokyo (JP); Yasunori Tanaka, Tokyo (JP)

(73) Assignee: DUPONT TEIJIN ADVANCED PAPERS (JAPAN), LTD., Tokyo (JP)

( * ) Notice: Subject to any disclaimer, the term of this patent is extended or adjusted under 35 U.S.C. 154(b) by 0 days.

(21) Appl. No.: 16/467,676

(22) PCT Filed: Nov. 20, 2017

(86) PCT No.: PCT/JP2017/041691
§ 371 (c)(1),
(2) Date: Jun. 7, 2019

(87) PCT Pub. No.: WO2018/105369
PCT Pub. Date: Jun. 14, 2018

(65) Prior Publication Data
US 2020/0061966 A1   Feb. 27, 2020

(30) Foreign Application Priority Data
Dec. 8, 2016   (JP) .................................. 2016-238712

(51) Int. Cl.
*H05K 9/00* (2006.01)
*B32B 7/02* (2019.01)

(52) U.S. Cl.
CPC ............... *B32B 7/02* (2013.01); *H05K 9/009* (2013.01); *H05K 9/0071* (2013.01);
(Continued)

(58) Field of Classification Search
CPC ........................... H05K 9/009; H05K 9/0088
See application file for complete search history.

(56) References Cited

U.S. PATENT DOCUMENTS

| 5,316,839 A | 5/1994 | Kato et al. | |
|---|---|---|---|
| 6,414,064 B1 * | 7/2002 | Matsuoka | ............... C08L 77/00 523/200 |

(Continued)

FOREIGN PATENT DOCUMENTS

| JP | 51-47103 | 4/1976 |
|---|---|---|
| JP | 57-115702 | 7/1982 |

(Continued)

OTHER PUBLICATIONS

International Search Report dated Feb. 6, 2018 in International Application No. PCT/JP2017/041691.

*Primary Examiner* — Hung V Ngo
(74) *Attorney, Agent, or Firm* — Wenderoth, Lind & Ponack, L.L.P.

(57) ABSTRACT

The present invention provides an electromagnetic wave suppression sheet provided with: an absorption layer which has surface resistivity of at least 100Ω/□ and which contains an electrical conductive material and an insulating material in the state where the electrical conductive material and the insulating material are in direct contact with each other, the insulating material having a dielectric loss tangent of 0.01 or larger at a frequency of 60 Hz at 20° C.; and a contact layer which is formed on a surface, of the absorption layer, opposite to a surface to be irradiated with electromagnetic waves and of which a surface in contact with the absorption layer has surface resistivity of at least 20Ω/□.

12 Claims, 1 Drawing Sheet

(52) U.S. Cl.
CPC ......... *H05K 9/0075* (2013.01); *H05K 9/0083* (2013.01); *H05K 9/0088* (2013.01)

(56) References Cited

U.S. PATENT DOCUMENTS

| | | | |
|---|---|---|---|
| 2004/0035489 A1* | 2/2004 | Thiriot | A41D 31/00 139/420 R |
| 2006/0266486 A1 | 11/2006 | Levit | |
| 2010/0206502 A1 | 8/2010 | Levit | |
| 2013/0157171 A1* | 6/2013 | Kurokawa | H01B 1/24 429/484 |

FOREIGN PATENT DOCUMENTS

| | | |
|---|---|---|
| JP | 4-80025 | 3/1992 |
| JP | 2003-309395 | 10/2003 |
| JP | 2008-542557 | 11/2008 |
| WO | 2015/033697 | 3/2015 |

\* cited by examiner

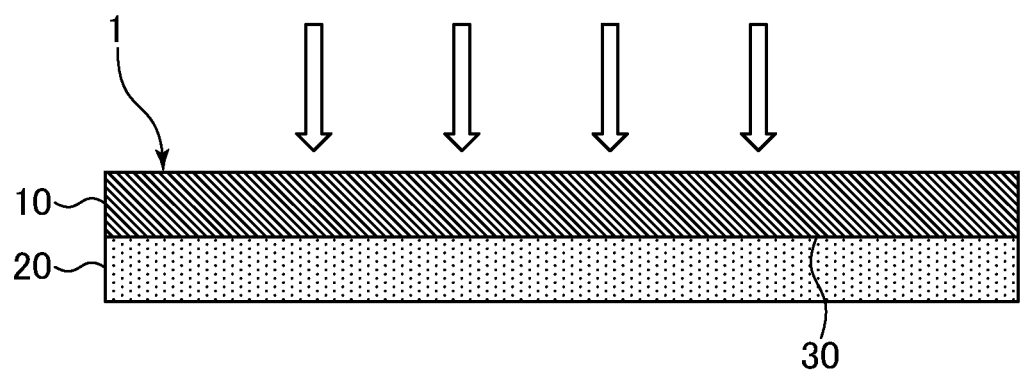

ELECTROMAGNETIC WAVE SUPPRESSION SHEET

TECHNICAL FIELD

The present invention relates to an electromagnetic wave suppression sheet.

BACKGROUND ART

With the development of an advanced information society and the arrival of a multimedia society, electromagnetic interference caused when electromagnetic waves generated from electronic devices have adverse effects on other devices and the human body is becoming a serious social issue. In the background of the increasingly worsening electromagnetic wave environment, electromagnetic wave shielding materials have been developed as a means of protection against electromagnetic waves.

Conventionally used electromagnetic wave shielding materials are ones obtained by covering, with a metal coating, a woven or knitted fabric such as a woven fabric made of a light-weight and flexible fiber, for example a synthetic polymer fiber. Examples of the means for forming a metal coating on a fiber include the vacuum vapor deposition method, the sputtering method, and the electroless plating method. The woven fabric woven with a metal-coated fiber as described above has problems that it is difficult to fabricate thin ones, shaping stability is low, and processability is not good.

A hybrid car and electric automobile society has arrived in recent years, and these automobiles use a direct current of 400 to 600 V. This direct current has switching noise to a large degree and is a source of low frequency noise. However, thinness and light-weight property are not satisfied by electromagnetic wave absorbers for electromagnetic waves in the vicinity of 1 GHz which could affect carcinogenicity and cause malfunction of electronic devices and for low frequency electromagnetic waves of 10 MHz or less which could affect the human body.

A material selected in advance from electromagnetic wave shielding materials according to the absorption frequency is used in the electromagnetic wave absorber having an ability of absorbing electromagnetic waves, and a method is used in which the thickness thereof is changed in order to satisfy conditions such as the desired absorption frequency and the maximum absorption amount at that frequency. For example, a λ/4 type electromagnetic wave absorber requires a thickness of about 50 cm for an electromagnetic wave of 100 MHz. A thickness greater than that is required at lower frequencies. Moreover, since backing with a metal plate is required, practical use is difficult.

For the purpose of reducing the weight of the vehicle body of a hybrid car or an electric automobile, a more light-weight electromagnetic wave absorber capable of absorbing a wide range of frequencies even including electromagnetic waves of low frequency, for example 1 GHz or less and furthermore 10 MHz or less is required.

In addition, with the size reduction and weight reduction of motor and inverter, there is a demand for electromagnetic wave absorbing materials having high heat resistance which can withstand the heat generation of conducting wire due to a large high-frequency electric current flowing from the inverter to the electric motor. There is a demand for materials with high heat resistance because of a large temperature rise of equipment particularly in electric/electronic devices such as large rotating machines to which a high voltage is applied.

As an electrical insulator and a thin leaf structure material, high heat resistance aramid paper is widely used as an electrically insulating material of the rotating machine described above (generator, electric motor), a transformer field, and electric/electronic devices, and studies have been conducted so far on the use of this aramid paper as an electric field relaxing material by giving a certain degree of conductivity.

Japanese Patent Application Publication No. Sho 51-47103 and Japanese Patent Application Publication No. Sho 57-115702 disclose paper using an aramid fibrid and a carbon fiber or a metal fiber. In addition, Published Japanese Translation of PCT International Application Publication No. 2008-542557 discloses an electromagnetic wave suppression sheet which is composed of an aramid short fiber, an aramid fibrid, and a conductive filler such as a carbon fiber.

However, none of them aims at the electromagnetic wave absorption described above and thus satisfies characteristics which have important relationships as electromagnetic wave absorption characteristics, for example dielectric loss characteristics and scattering characteristics.

SUMMARY OF INVENTION

The present invention aims to provide an electromagnetic wave suppression sheet which has a high heat resistance and reduced weight and which is capable of absorbing electromagnetic waves of a wide range of frequencies including low frequencies.

The present inventors have made earnest studies to achieve the above object and found as a result that the above object can be achieved by adjusting a sheet which contains a conductive substance and a substance having a dielectric loss tangent equal to or larger than a specific value. This finding has led to the completion of the present invention.

An embodiment of the present invention is an electromagnetic wave suppression sheet comprising: an absorption layer which has a surface resistivity of 100Ω/□ or more and which includes a conductive substance and an insulating material having a dielectric loss tangent of 0.01 or more at 20° C. and a frequency of 60 Hz in a state where the conductive substance and the insulating material are in direct contact with each other; and a contact layer which is formed on a surface opposite to a surface of the absorption layer to be irradiated with an electromagnetic wave and in which a surface in contact with the absorption layer has a surface resistivity of 20Ω/□ or more.

Preferably, the conductive substance is a carbon fiber.

Preferably, a relative permittivity of the insulating material at 20° C. and a frequency of 60 Hz is 4 or less.

Preferably, the insulating material is polymetaphenylene isophthalamide.

Preferably, a thickness of the absorption layer is ¼ or less of a wavelength of the irradiation electromagnetic wave.

Preferably, the following formula (1) is satisfied for electromagnetic waves having frequencies of 10 kHz and 2 GHz $$A+B \leq 70 \qquad (1),$$

wherein A is a reflectance (%) of the electromagnetic wave, and B is a transmittance (%) of the electromagnetic wave.

Preferably, the following formula (2) is satisfied for electromagnetic waves having a frequency of 10 kHz and a frequency of 2 GHz $$0.9 \leq C/D \leq 1.1 \quad (2)$$

wherein C is a sum of the reflectance (%) and the transmittance (%) for the electromagnetic wave having a frequency of 10 kHz, and D is a sum of the reflectance (%) and the transmittance (%) for the electromagnetic wave having a frequency of 2 GHz.

Preferably, a transmittance of an electromagnetic wave having a frequency of 18 GHz is 1% or less.

Preferably, the electromagnetic wave suppression sheet has a thickness of 300 µm or more and 1000 µm or less.

Preferably, the electromagnetic wave suppression sheet has a retention rate of a tensile strength at 300° C. for 1 hour of 90% or more.

Preferably, the absorption layer is a hot pressed sheet.

Another embodiment of the present invention is an electrical insulator comprising the electromagnetic wave suppression sheet described above.

Still another embodiment of the present invention is an electromagnetic wave suppression sheet comprising: (1) an absorption layer which has a surface resistivity of 100Ω/□ or more and which includes a conductive substance selected from the group consisting of metal fibers, carbon fibers, carbon black, metal plated fibers, metal powder mixed fiber, and carbon black mixed fibers, and an insulating material being a fibrid and a short fiber composed of a material selected from the group consisting of polymetaphenylene isophthalamide and copolymers thereof, polyvinyl chloride, polymethyl methacrylate, methyl methacrylate/styrene copolymers, polychlorotrifluoroethylene, polyvinylidene fluoride, polyvinylidene chloride, Nylon 6, and Nylon 66 in a state where the conductive substance and the insulating material are in direct contact with each other; and (2) a contact layer which is formed on a surface opposite to a surface of the absorption layer to be irradiated with an electromagnetic wave and in which a surface in contact with the absorption layer has a surface resistivity of 20Ω/□ or more.

BRIEF DESCRIPTION OF DRAWINGS

FIG. 1 is a perspective view illustrating an electromagnetic wave suppression sheet of an embodiment of the present invention.

DESCRIPTION OF EMBODIMENTS

Hereinafter, the present invention is described in detail.
(Conductive Substance)

Examples of the conductive substance used in the present invention include fibrous or fine particle shaped (powder or flake) products having a wide range of conductivity, such as a conductor having a volume resistivity of about $10^{-1}$ Ω·cm or less and a semiconductor having a volume resistivity of about $10^{-1}$ to $10^{8}$ Ω·cm.

Regarding the conductive substance in the present invention, it is desirable that the size of at least the minimum part thereof is ¼ or less of the wavelength of the irradiation electromagnetic wave. Here, the wavelength of the electromagnetic wave is expressed by the following formula.

$$\lambda = 1/(\varepsilon^{1/2} \times \mu^{1/2} \times f),$$

wherein λ is the wavelength (m) of the electromagnetic wave, ε is the permittivity ($m^{-3}$ $kg^{-1}$ $s^{4}$ $A^{2}$) of the medium, µ is the magnetic permeability (H/m) of the medium, and f is the frequency (Hz) of the electromagnetic wave.

For example, when the frequency of the irradiation electromagnetic wave is 60 Hz to 300 GHz and the medium is a vacuum or air, the wavelength of the electromagnetic wave is 5000 km to 1 mm, and ¼ of the wavelength of the electromagnetic wave is 1250 km to 0.25 mm. When the size of the minimum part of the conductive substance is larger than ¼ of the wavelength of the electromagnetic wave, it is likely that the electromagnetic wave is transmitted without being absorbed.

Note that, in the case of a fibrous substance, the minimum part does not refer to the length of a fiber or a so-called fiber length but refers to the short diameter of the cross section perpendicular to the length direction. In addition, in the case of a film shaped small particle, it refers to the minimum part of the film thickness.

Examples of such a conductive substance include, but not limited to, materials having homogeneous conductivity such as metal fibers, carbon fibers, and carbon black and materials such as metal plated fibers, metal powder mixed fibers, and carbon black mixed fibers, which are obtained by mixing a conductive material and a non-conductive material to exhibit conductivity as a whole. Among these, it is preferable for the present invention to use a carbon fiber. The carbon fiber used in the present invention is preferably one obtained by firing a fibrous organic matter at high temperature in an inert atmosphere followed by carbonization. Carbon fibers are generally classified roughly into ones obtained by firing polyacrylonitrile (PAN) fibers and ones obtained by pitch spinning followed by firing. In addition to these, there are also carbon fibers produced by spinning resins such as rayon and phenol followed by firing, which can also be used in the present invention. It is possible to prevent heat cutting at the time of firing by using oxygen and the like prior to firing to carry out oxidation cross-linking treatment.

The fineness of the fiber which is the conductive substance used in the present invention is not particularly limited as long as the short diameter thereof is ¼ or less of the irradiation electromagnetic wave. In addition, the fiber length is selected from the range of 1 mm to 20 mm.

In the selection of the conductive substance, it is more preferable to use a material having high conductivity and exhibiting good dispersion in the wet paper making method to be described later. In addition, in the selection of the carbon fiber, it is preferable to select one having further higher strength and less likely to be embrittled. Selection of such a material makes it possible to obtain conductivity suitable for the electromagnetic wave suppression sheet. In addition, it is possible to obtain an electromagnetic wave suppression sheet densified to a specific range by hot pressing.

(Insulating Material Having Dielectric Loss Tangent of 0.01 or More)

The insulating material having a dielectric loss tangent of 0.01 or more in the present invention refers to a substance having a dielectric loss tangent of 0.01 or more under the condition of irradiation with an electromagnetic wave of 60 Hz at 20° C. Generally, the insulating material absorbs a larger amount of electromagnetic wave as the dielectric loss expressed by the following formula is larger.

$$P = E^2 \times \tan \delta \times 2\pi f \times \varepsilon_r \times \varepsilon_0 \times S/d (W)$$

wherein P means the dielectric loss (W), E the voltage (V), tan δ the dielectric loss tangent of the insulating material, f the frequency (Hz), $\varepsilon_r$ the relative permittivity of the insulating material, $\varepsilon_0$ the permittivity of vacuum (8.85418782×

$10^{-12}$ ($m^{-3}$ $kg^{-1}$ $s^4$ $A^2$)), S the contact area ($m^2$) between the conductive substance and the insulating material, and d the distance (m) between the conductive substances.

Since the dielectric loss is proportional to the contact area between the conductive material and the insulating material as shown in the above formula, the shape of the insulating material is preferably, but not limited to, a film shaped microparticle having a large contact area.

Regarding the insulating material, it is preferable that the size of at least the minimum part thereof is ¼ or less of the wavelength of the irradiation electromagnetic wave.

When the size of the minimum part of the insulating material is larger than ¼ of the wavelength of the electromagnetic wave, it is likely that the electromagnetic wave is transmitted without being absorbed.

Note that, in the case of a fibrous substance, the minimum part does not refer to the length of a fiber or a so-called fiber length but refers to the short diameter of the cross section perpendicular to the length direction. In addition, in the case of a film shaped small particle, it refers to the minimum part of the film thickness.

The relative permittivity of the insulating material at 20° C. and a frequency of 60 Hz is preferably 4 or less. When the relative permittivity is low, it is difficult for the electromagnetic wave to be reflected, which is considered to be suitable as the insulating material of the present invention.

Examples of the insulating material include, but not limited to, polymetaphenylene isophthalamide and copolymers thereof, polyvinyl chloride, polymethyl methacrylate, methyl methacrylate/styrene copolymers, polychlorotrifluoroethylene, polyvinylidene fluoride, polyvinylidene chloride, Nylon 6, and Nylon 66, all of which have a dielectric loss tangent of 0.01 or more at 20° C. and 60 Hz.

Among these insulating materials, polymetaphenylene isophthalamide and copolymers thereof, polymethyl methacrylate, methyl methacrylate/styrene copolymer, polychlorotrifluoroethylene, and Nylon 66 are considered to be suitable as the insulating material of the present invention because their relative permittivity at 20° C. and a frequency of 60 Hz is as small as 4 or less, making it difficult for the electromagnetic wave to be reflected.

Among these insulating materials, fibrids and/or short fibers of polymetaphenylene isophthalamide are preferably used in that they have characteristics such as good formation processability, flame retardancy, and heat resistance. In particular, fibrids of polymetaphenylene isophthalamide are preferably used in that, due to the form of the film shaped microparticle, the contact area with the conductive substance is increased and thus the dielectric loss described above is increased, which increases the amount of electromagnetic wave absorbed.

(Fibrid)

The fibrid used in the present invention means a film shaped microparticle and is sometimes called as, for example, aramid pulp in the case of a film shaped microparticle composed of polymetaphenylene isophthalamide. Examples of the production method include the methods described in, for example, Japanese Examined Patent Application Publication No. Sho 35-11851, Japanese Examined Patent Application Publication No. Sho 37-5732, and the like. Since a fibrid has paper making properties as in the case of ordinary wood (cellulose) pulp, it can be formed into a sheet shape with a paper making machine after being dispersed in water. In this case, so-called beating treatment can be carried out for the purpose of maintaining quality suitable for paper making. This beating treatment can be carried out by a disk refiner, a beater, or other paper making raw material treatment equipment which exerts a mechanical cutting action. In this operation, the change in the form of the fibrid can be monitored by the freeness specified in JIS P8121. In the present invention, the freeness of an aramid fibrid after being subjected to beating treatment is preferably in the range of 10 to 300 $cm^3$ (Canadian standard freeness). A fibrid having a freeness larger than this range has a possibility of reducing the strength of the sheet to be formed therefrom. On the other hand, the case of attempting to obtain a freeness of less than 10 $cm^3$ may result in a situation where the utilization efficiency of the input mechanical power is reduced, the throughput per unit time is often reduced, and moreover the refinement of fibrid progresses too much, making it likely to deteriorate the so-called binder function. Therefore, no particular advantage is found in an attempt to obtain a freeness of less than 10 $cm^3$.

(Short Fiber)

The short fiber used in the present invention refers to a fiber cut into a predetermined length, and examples of the fiber made from polymetaphenylene isophthalamide include, but not limited to, ones available under the trade names of "Teijinconex (registered trademark)" by Teijin Limited and "Nomex (registered trademark)" by DuPont.

The short fiber preferably has a short diameter equal to or less than ¼ of the irradiation electromagnetic wave. Although the size is not particularly limited, it may preferably have a fineness in the range of 0.05 dtex or more and less than 25 dtex. Fibers having a fineness of less than 0.05 dtex are undesirable because they tend to cause aggregation in the production by the wet method to be described later. In addition, fibers having a fineness of 25 dtex or more are too large in fiber diameter. For this reason, in the case of a diameter of 45 μm or more with a perfect circular shape and a density of 1.4 $g/cm^3$, for example, there may be disadvantages such as decrease in aspect ratio, suppression of mechanical reinforcement effect, and poor uniformity of the electromagnetic wave suppression sheet. In the case of poor uniformity of the electromagnetic wave suppression sheet, there is a possibility that the conductivity of the electromagnetic wave suppression sheet varies, making it impossible to sufficiently exhibit the required electromagnetic wave suppression function.

The length of the aramid short fiber can be selected from the range of 1 mm or more and less than 25 mm and preferably 2 to 12 mm. When the length of the short fiber is less than 1 mm, the mechanical properties of the electromagnetic wave suppression sheet are deteriorated. On the other hand, ones having a length of 25 mm or more are undesirable because the production of an electromagnetic wave suppression sheet by the wet method to be described later is likely to involve "knotting," "binding," and the like, resulting in defects.

(Electromagnetic Wave Suppression Sheet)

FIG. 1 illustrates an embodiment of the electromagnetic wave suppression sheet of the present invention. In the embodiment illustrated in FIG. 1, the electromagnetic wave suppression sheet 1 has a stack configuration of one absorption layer 10 and one contact layer 20. The absorption layer 10 includes a conductive substance and an insulating material having a dielectric loss tangent of 0.01 or more at 20° C. and a frequency of 60 Hz in a state where the conductive substance and the insulating material are in direct contact with each other. The surface resistivity of the absorption layer 10 is 100Ω/□ or more. The electromagnetic wave is incident on the upper portion of the paper surface. The contact layer 20 is stacked on an opposite surface 30 opposite to the surface to be irradiated with the electromagnetic wave. The surface resistivity of the contact layer 20 on the opposite surface 30 side is 20Ω/□ or more.

The absorption layer includes the conductive substance and the insulating material in a state where the conductive substance and the insulating material are in direct contact with each other. The state where they are in direct contact with each other means a state where they are in contact with each other without involving another material in between. Preferably, the conductive material and the insulating material are substantially mixed uniformly in the absorption layer.

The content of the conductive substance is not particularly limited as long as a predetermined surface resistivity can be obtained, and is generally preferably 0.5 to 30 wt % and more preferably 1 to 20 wt % based on the weight of the absorption layer. A larger content facilitates the preparation of sheets simultaneously satisfying (1) and (2) described above as the sheet density calculated from (basis weight/thickness) specified in JIS C 2300-2 is smaller. For example, when the sheet density is in the range of 0.5 to 0.8 g/cm$^3$, the content of the conductive substance preferably takes a value of 1 to 10 wt % based on the weight of the absorption layer. When the sheet density is in the range of 0.1 to 0.5 g/cm$^3$, it is preferable to take a value of 5 to 20 wt % based on the weight of the absorption layer.

The content of the insulating material is preferably 70 to 99.5 wt % and more preferably 80 to 99 wt % based on the weight of the absorption layer. For example, when the sheet density is in the range of 0.5 to 0.8 g/cm$^3$, it is preferable to take a value of 90 to 99 wt % based on the weight of the absorption layer. When the sheet density is in the range of 0.1 to 0.5 g/cm$^3$, it is preferable to take a value of 80 to 95 wt % based on the weight of the absorption layer.

The absorption layer may include materials other than the conductive material and the insulating material. The absorption layer may be added with, for example, a dispersibility improver, a defoamer, a paper strength enhancer, an acrylic resin, a fixing agent, a polymer flocculant, an organic fiber, an inorganic fiber, and the like as long as the object of the present invention is not impaired. The content of these other additives is preferably 20 wt % or less based on the weight of the absorption layer.

The thickness of the absorption layer is preferably ¼ or less of the wavelength of the irradiation electromagnetic wave. Specifically, the thickness of the absorption layer is preferably 5 to 1000 μm and more preferably 10 to 700 μm. When the absorption layer is within these ranges, it is possible to expect efficient absorption of electromagnetic wave.

The contact layer may include two or more consecutive layers having the same structure as that of the absorption layer without boundary or include layers of different structures. In the case of consecutive layers of the same structure without boundary, the second layer corresponds to the contact layer. Examples of the contact layer include an adhesive layer of adhesive, an air layer of air, and an insulating layer of film or the like. In the case of consecutively stacked layers of the same structure as the absorption layer, the number of layers stacked is not particularly limited. The number of layers stacked may be determined as appropriate in consideration of stacking effort and sheet thickness. For example, the number can be 25 layers or less, 20 layers or less, 15 layers or less, 12 layers or less, or 10 layers or less. There is no particular limitation on the bonding means in the case of consecutively stacked layers of the same structure as the absorption layer. The layers may be simply stacked without chemical bonding such as adhesive or pressure bonding.

In the contact layer, the surface resistivity of the surface in contact with the absorption layer is 20Ω/□ or more. When the surface resistivity is less than 20Ω/□, there is a possibility that the closing of the electric field of the electromagnetic wave in that layer prevents the generation of a strong electric field in the absorption layer, greatly reducing the effect of absorbing electromagnetic waves.

Too thick a contact layer is likely to be an obstacle to space saving in, for example, installation on the electrical insulator to be described later. Therefore, the thickness of the contact layer is preferably 5 to 2000 μm and more preferably 50 to 300 μm.

The electromagnetic wave suppression sheet of the present invention preferably satisfies the following formula (1) for an electromagnetic wave having a frequency of 10 kHz and an electromagnetic wave having a frequency of 2 GHz.

$$A+B \leq 70 \tag{1}$$

wherein A is a reflectance (%) of the electromagnetic wave, and B is a transmittance (%) of the electromagnetic wave.

When A+B>70, there is a risk that a sufficient electromagnetic wave absorption function as an electromagnetic wave suppression sheet is not exhibited.

In addition, the electromagnetic wave suppression sheet of the present invention preferably satisfies the following formula (2) for electromagnetic waves having a frequency of 10 kHz and a frequency of 2 GHz.

$$0.9 \leq C/D \leq 1.1 \tag{2}$$

wherein C is a sum of the reflectance (%) and the transmittance (%) for the electromagnetic wave having a frequency of 10 kHz, and D is a sum of the reflectance (%) and the transmittance (%) for the electromagnetic wave having a frequency of 2 GHz.

In addition, in the electromagnetic wave suppression sheet of the present invention, the transmittance of the electromagnetic wave having a frequency of 18 GHz is preferably 1% or less.

In addition, in the electromagnetic wave suppression sheet of the present invention, the retention rate of tensile strength at 300° C. for 1 hour is preferably 90% or more.

The thickness of the electromagnetic wave suppression sheet of the present invention is not particularly limited, but generally has a thickness in a range of preferably 10 μm to 5000 μm, more preferably 300 to 1000 μm, and further preferably 400 to 700 μm. When the thickness is less than 10 μm, there is a risk that the electromagnetic wave transmittance is high and the electromagnetic wave transmission suppression function as an electromagnetic wave suppression sheet is sufficient. On the other hand, a thickness exceeding 5000 μm is likely to be an obstacle to space saving in installation on the electrical insulator to be described later.

(Production of Electromagnetic Wave Suppression Sheet)

The electromagnetic wave suppression sheet of the present invention can be produced by a method in which the conductive substance and the insulating material having a dielectric loss tangent of 0.01 or more described above are mixed to form a sheet. Specific examples applicable include a method in which a conductive substance, the fibrid, and the short fiber described above are blended in a dry manner followed by use of air stream to form a sheet, and a method in which a conductive substance, the fibrid, and the short fiber described above are dispersed and mixed in a liquid medium and discharged onto a liquid permeable support such as a mesh or a belt to form a sheet, followed by removal of liquid for drying. Preferably selected among these is a so-called wet paper making method which uses water as a medium.

In the wet paper making method, it is common to feed an aqueous slurry of single one of or a mixture of at least a conductive material, the fibrid, and the short fiber described above to a paper making machine for dispersion, followed by dehydration, dewatering, and drying operations to wind it up as a sheet. Examples of the paper making machine usable can include Fourdrinier paper making machines, cylinder paper making machines, inclined paper making machines, and combination paper making machines combining these. In the case of production with a combination paper making machine, it is also possible to obtain a composite sheet composed of several paper layers by sheet-forming and coalescing aqueous slurries having different blending ratios. An additive such as a dispersibility improver, a defoamer, or a paper strength enhancer may be used if necessary in wet paper making. In addition, when the conductive substance is a particle shaped product, an acrylic resin, a fixing agent, a polymer flocculant, or the like may be added. However, it is necessary to pay attention to their use so as not to hinder the object of the present invention.

In addition, as long as the object of the present invention is not impaired, the electromagnetic wave suppression sheet of the present invention may be added with other fibrous components in addition to the above components, for example an organic fiber such as a polyphenylene sulfide fiber, a polyether ether ketone fiber, a cellulose-based fiber, a polyvinyl alcohol fiber, a polyester fiber, a polyarylate fiber, a liquid crystal polyester fiber, a polyimide fiber, a polyamide imide fiber, or a polyparaphenylene benzobisoxazole fiber or an inorganic fiber such as a glass fiber, rock wool, and a boron fiber. Note that the above additives and other fibrous components used are preferably 20 wt % or less of the total weight of the electromagnetic wave suppression sheet.

The electromagnetic wave suppression sheet obtained in this way can be improved in mechanical strength by, for example, hot pressing at high temperature and high pressure between a pair of flat plates or metal rolls.

In the case of using metal rolls, for example, the conditions of the hot pressing can be exemplified in a temperature range of 100 to 400° C. and a linear pressure range of 50 to 1000 kg/cm. For the purpose of obtaining a high tensile strength and surface smoothness, the roll temperature is preferably 330° C. or more and more preferably 330° C. to 380° C. Also, the linear pressure is preferably 50 to 500 kg/cm. The temperature is higher than the glass transition temperature of polymetaphenylene isophthalamide and close to the crystallization temperature of polymetaphenylene isophthalamide. For these reasons, not only hot pressing at that temperature improves mechanical strength, but also strong close contact between the materials constituting the electromagnetic wave suppression sheet can increase, for example, the contact area between the conductive substance and the insulating material having a dielectric loss tangent of 0.01 or more. In addition, when the conductive substance is a carbon fiber, it is possible to prevent the scattering thereof as well as to suppress direct contact with fibers, attaching to the skin and the like due to scattering of fibers, and the skin irritation such as itching and pain due thereto in a situation of processing or using electromagnetic wave suppression sheets.

The above hot pressing may be carried out more than once, and two or more sheet shaped products obtained by the above-described method may be placed on one another to carry out hot pressing.

Moreover, sheet shaped products obtained by the above-described method may be adhered using an adhesive or the like to adjust the electromagnetic wave transmission suppression performance and the thickness.

The electromagnetic wave suppression sheet of the present invention has excellent characteristics such as (1) the sheet has an electromagnetic wave absorption property, (2) the sheet has an electromagnetic wave transmission suppression property and does not require sheet backing with a metal plate as in a $\lambda/4$ type electromagnetic wave absorber, (3) the sheet exhibits the characteristics (1) and (2) at a wide range of frequencies including low frequencies, (4) the sheet has heat resistance and flame retardancy, and (5) the sheet has good processability, and can be suitably used as an electromagnetic wave suppression sheet of electric and electronic devices and the like, particularly electronic devices in hybrid cars and electric automobiles requiring weight reduction.

(Electrical Insulator Including Electromagnetic Wave Suppression Sheet)

The electromagnetic wave suppression sheet in the present invention can be applied to various electrical insulators. The electromagnetic wave suppression sheet of the present invention is attached using an adhesive to a sheet or housing having a volume resistivity exceeding $10^6$ ($\Omega$cm). A thermoplastic resin or the like having a volume resistivity exceeding $10^6$ ($\Omega$cm) may be melted and impregnated in the electromagnetic wave suppression sheet in the present invention. Alternatively, a thermosetting resin or the like having a volume resistivity exceeding $10^6$ ($\Omega$cm) may be impregnated in the electromagnetic wave suppression sheet of the present invention followed by curing.

Since the electromagnetic wave suppression sheet of the present invention does not require sheet backing with a metal plate, the sheet can be used by being attached to the surface of an electrical insulator such as a resin as described above or by being enclosed in the resin, which contributes to resinification and weight reduction of housings such as motors and inverters.

EXAMPLES

Hereinafter, the present invention is described further specifically with reference to examples. These examples are merely illustrative, and are not intended at all to limit the content of the present invention.

(Measurement Method)

(1) Sheet Mark, Thickness, and Density

The measurement was carried out in accordance with JIS C 2300-2 and the density was calculated by (mark/thickness).

(2) Tensile Strength

The width was 15 mm, the chuck interval was 50 mm, and the pulling rate was 50 mm/min.

(3) Surface Resistivity

The measurement was carried out in accordance with ASTM D-257.

Note that the inequality symbols (>, <) indicate out of measurement range.

(4) Volume Resistivity

The measurement was carried out in accordance with ASTM D-257.

Note that the inequality symbols (>, <) indicate out of measurement range.
(5) Heat Resistance The tensile strength was measured after retention for 1 hour at the temperatures shown in Tables 3, 4, and 6.

The retention rate of tensile strength was calculated by (tensile strength after retention/tensile strength before retention).
(6) Permittivity and Dielectric Loss Tangent The measurement was carried out in accordance with JIS K6911.
(7) Electromagnetic Wave Suppression Performance 1 (Low Frequency Region)

Measurement was carried out based on a coaxial tube type shield effect measurement system (in accordance with ASTM D4935). Specifically, a sample sheet was held in the coaxial tube, an electromagnetic wave was sent, and a network analyzer was used to measure the reflectance and transmittance at each frequency at that time.

In the above measurement, the reflectance and the transmittance are defined as follows.

reflectance $(A)$=power of reflected wave/power of incident wave×100(%)

transmittance $(B)$=power of transmitted wave/power of incident wave×100(%)

Note that since the measurement system is tightly sealed with metal in the coaxial tube type shield effect measurement system, 100−(A+B) represents the electromagnetic wave absorption rate by the sample sheet. It can be said that the smaller the A+B is, the higher the electromagnetic wave absorption rate by the sample sheet is.
(8) Electromagnetic Wave Suppression Performance 2 (High Frequency Region)

Measurement was carried out by the free space method. Specifically, an antenna, a lens, the sample sheet, a lens, and an antenna were arranged in this order, an electromagnetic wave was sent, and a network analyzer was used to measure the reflectance and transmittance at each frequency at that time.

In the above measurement, the reflectance and the transmittance are defined as follows.

reflectance $(A)$=power of reflected wave/power of incident wave×100(%)

transmittance $(B)$=power of transmitted wave/power of incident wave×100(%)

Note that since the measurement system is not tightly sealed in the free space method, 100−(A+B) represents the sum of electromagnetic wave absorption rate and electromagnetic wave scattering rate by the sample sheet. It can be said that the smaller the A+B is, the larger the sum of the electromagnetic wave absorption rate and the electromagnetic wave scattering rate by the sample sheet is.
(Raw Material Preparation)

The pulp particle production apparatus (wet type precipitator) formed by a combination of a stator and a rotor described in Japanese Patent Application Publication No. Sho 52-15621 was used to produce a fibrid of polymetaphenylene isophthalamide (hereinafter referred to as the "meta aramid fibrid"). This was treated with a beating machine to adjust the length weighted average fiber length to 0.9 mm (freeness of 200 cm$^3$). On the other hand, as a short fiber of polymetaphenylene isophthalamide, a meta aramid fiber manufactured by Du Pont (Nomex (registered trademark), single thread fineness of 2.2 dtex) was cut to a length of 6 mm (hereinafter referred to as the "meta aramid short fiber") to prepare a raw material for paper making.
(Measurement of Permittivity and Dielectric Loss Tangent)

Table 1 shows the result of preparing a cast film of polymetaphenylene isophthalamide and measuring the permittivity and the dielectric loss tangent by the bridge method.

TABLE 1

| Frequency Hz | Relative Permittivity | Dielectric Loss Tangent |
|---|---|---|
| 60 | 2.81 | 0.013 |
| 1k | 2.74 | 0.015 |
| 1M | 2.79 | 0.028 |

Reference Examples 1 to 5

(Sheet Preparation)

Each of the meta aramid fibrid, the meta aramid short fiber, and the carbon fiber (manufactured by Toho Tenax Co., Ltd., fiber length of 3 mm, single fiber diameter of 7 μm, fineness of 0.67 dtex, and volume resistivity of 1.6×10$^{-3}$ Ω·cm) prepared as described above was dispersed in water to prepare a slurry. These slurries were mixed to the blend ratios of the meta aramid fibrid, the meta aramid short fiber, and the carbon fiber shown in Table 2 and were treated with a Tappi type hand paper making machine (cross sectional area of 325 cm$^2$) to prepare sheet shaped products shown in Table 2. Next, the obtained sheets were subjected to hot pressing with a pair of metal calender rolls under the conditions shown in Table 2 to obtain sheet shaped products.

In addition, ingot-shaped copper was rolled to obtain a copper foil sheet.

Table 2 shows the main characteristic values of the sheets obtained in this way.

TABLE 2

| Characteristic | Unit | Reference Example 1 | Reference Example 2 | Reference Example 3 | Reference Example 4 | Reference Example 5 |
|---|---|---|---|---|---|---|
| Raw Material Composition | | | | | | |
| Meta Aramid Fibrid | wt % | 50 | 50 | 50 | 50 | |
| Meta Aramid Short Fiber | | 45 | 45 | 50 | 50 | |

TABLE 2-continued

| Characteristic | Unit | Reference Example 1 | Reference Example 2 | Reference Example 3 | Reference Example 4 | Reference Example 5 |
|---|---|---|---|---|---|---|
| Carbon Fiber | | 5 | 5 | | | |
| Copper | | | | | | 100 |
| Hot Pressing Conditions | | | | | | |
| Roll Temperature | °C. | None | 350 | None | 350 | None |
| Linear Pressure | kgf/cm | | 150 | | 150 | |
| Basis Weight | g/m$^2$ | 38.5 | 39 | 39 | 41 | 308.7 |
| Thickness | μm | 128 | 57 | 138 | 57 | 35 |
| Density | g/cm$^3$ | 0.30 | 0.68 | 0.28 | 0.72 | 8.82 |
| Surface Resistivity | Ω/□ | $1.04 \times 10^3$ | $0.34 \times 10^3$ | $>10^8$ | $>10^8$ | $<0.1$ |
| Volume Resistivity | Ω·cm | $1.80 \times 10^5$ | $8.3 \times 10^4$ | $>10^{11}$ | $>10^{11}$ | $<714$ |

Examples 1 to 7

The sheets produced in Reference Examples above were stacked so as to obtain sheets having the configurations shown in Tables 3 and 4. Tables 3 and 4 show the main characteristic values of the electromagnetic wave suppression sheets obtained in this way.

Note that Examples 1 and 2 had an air layer as a contact layer present between the sample sheet and the receiving antenna of the network analyzer, on the transmission side opposite to the electromagnetic wave irradiation side. Note that the surface resistivity of the air layer was $>10^8 \Omega/\square$.

TABLE 3

| Characteristic | Unit | Example 1 | Example 2 | Example 3 | Example 4 | Example 5 |
|---|---|---|---|---|---|---|
| Configuration | | Sheet of Reference Example 1 | Sheet of Reference Example 2 | Two Stacked Sheets of Reference Example 2 | Four Stacked Sheets of Reference Example 2 | Three Stacked Sheets of Reference Examples 2, 4, and 2 In This Order |
| Basis Weight | g/m$^2$ | 38.5 | 39 | 78 | 156 | 119 |
| Thickness | μm | 128 | 57 | 114 | 228 | 171 |
| Density | g/cm$^3$ | 0.30 | 0.68 | 0.68 | 0.68 | 0.70 |
| Surface Resistivity | Ω/□ | $1.04 \times 10^3$ | $0.34 \times 10^3$ | $0.32 \times 10^3$ | $0.31 \times 10^3$ | $0.33 \times 10^3$ |
| Volume Resistivity | Ω·cm | $1.80 \times 10^5$ | $8.3 \times 10^4$ | $8.4 \times 10^4$ | $8.3 \times 10^4$ | $>10^{11}$ |
| Tensile Strength | kgf/15 mm | 1.7 | 4.7 | 9.4 | 18.8 | 14.1 |
| Tensile Strength | | | | | | |
| 250° C., After 1 Hour | kgf/15 mm | 2.0 | 4.7 | 9.4 | 18.8 | 14.1 |
| 300° C., After 1 Hour | | 2.3 | 4.6 | 9.2 | 18.6 | 14.0 |
| Tensile Strength Retention Rate | | | | | | |
| 250° C., After 1 Hour | % | 118 | 100 | 100 | 100 | 100 |
| 300° C., After 1 Hour | | 135 | 98 | 98 | 99 | 99 |
| Electromagnetic Wave Suppression Performance 1 | | | | | | |
| 10 kHz A | % | 7.3 | 20.6 | 48.7 | 57.8 | 48.0 |
| B | | 52.7 | 29.3 | 9.1 | 5.8 | 9.4 |
| 100 − (A + B) | | 40.0 | 50.1 | 42.2 | 36.4 | 42.6 |
| 15 MHz A | | 7.2 | 20.6 | 48.7 | 57.8 | 48.0 |
| B | | 52.6 | 29.3 | 9.1 | 5.8 | 9.4 |
| 100 − (A + B) | | 40.2 | 50.1 | 42.2 | 36.4 | 42.6 |
| 2 GHz A | | 8.1 | 20.9 | 48.8 | 58.7 | 48.2 |
| B | | 51.1 | 29.1 | 9.1 | 5.5 | 9.4 |
| 100 − (A + B) | | 40.8 | 50.0 | 42.1 | 35.8 | 42.4 |
| C (10 kHz, A + B) | % | 60.0 | 49.9 | 57.8 | 63.6 | 57.4 |
| D (2 GHz, A + B) | % | 59.2 | 50.0 | 57.9 | 64.2 | 57.6 |
| C/D | | 1.01 | 1.00 | 1.00 | 0.99 | 1.00 |

TABLE 4

| Characteristic | Unit | Example 2 | Example 3 | Example 4 | Example 6 | Example 7 |
|---|---|---|---|---|---|---|
| Configuration | | Sheet of Reference Example 2 | Two Stacked Sheets of Reference Example 2 | Four Stacked Sheets of Reference Example 2 | Eight Stacked Sheets of Reference Example 2 | Twelve Stacked Sheets of Reference Example 2 |

TABLE 4-continued

| Characteristic | Unit | Example 2 | Example 3 | Example 4 | Example 6 | Example 7 |
|---|---|---|---|---|---|---|
| Basis Weight | g/m² | 39 | 78 | 156 | 312 | 468 |
| Thickness | μm | 57 | 114 | 228 | 456 | 684 |
| Density | g/cm³ | 0.68 | 0.68 | 0.68 | 0.68 | 0.68 |
| Surface Resistivity | Ω/□ | $0.34 \times 10^3$ | $0.32 \times 10^3$ | $0.31 \times 10^3$ | $0.30 \times 10^3$ | $0.29 \times 10^3$ |
| Volume Resistivity | Ω · cm | $8.3 \times 10^4$ | $8.4 \times 10^4$ | $8.3 \times 10^4$ | $8.4 \times 10^4$ | $8.3 \times 10^4$ |
| Tensile Strength | kgf/15 mm | 4.7 | 9.4 | 18.8 | 37.6 | 56.4 |
| Tensile Strength | | | | | | |
| 250° C., After 1 Hour | kgf/15 mm | 4.7 | 9.4 | 18.8 | 37.6 | 56.4 |
| 300° C., After 1 Hour | | 4.6 | 9.2 | 18.6 | 37.5 | 56.3 |
| Tensile Strength Retention Rate | | | | | | |
| 250° C., After 1 Hour | % | 100 | 100 | 100 | 100 | 100 |
| 300° C., After 1 Hour | | 98 | 98 | 99 | 100 | 100 |
| Electromagnetic Wave Suppression Performance 2 | | | | | | |
| 18 GHz A | % | 14.7 | 22.3 | 37.3 | 40.4 | 53.9 |
| B | | 40.0 | 22.1 | 7.9 | 1.8 | 0.76 |
| 100 − (A + B) | | 45.3 | 55.6 | 54.8 | 57.8 | 45.4 |
| 26.5 GHz A | | 17.1 | 24.5 | 32.8 | 34.2 | 46.2 |
| B | | 36.4 | 19.1 | 5.8 | 0.68 | 0.30 |
| 100 − (A + B) | | 46.5 | 56.4 | 61.5 | 65.1 | 53.5 |
| E (18 kHz, A + B) | % | 54.7 | 44.4 | 45.2 | 42.2 | 54.6 |
| F (26.5 GHz, A + B) | % | 53.5 | 43.6 | 38.5 | 34.9 | 46.5 |
| E/F | | 1.02 | 1.02 | 1.17 | 1.21 | 1.18 |

Note that since the thickness of the sheets of Examples 6 and 7 is large and the error is large in the measurement of the electromagnetic wave suppression performance 1, Table 5 shows the values of B calculated from the thicknesses of Examples 2 to 4 and the approximate curve for B.

approximate curve for 10 kHz $B = 36.968 e^{-0.009 \times (\text{sheet thickness (μm)})}$ approximate curve for 2 GHz $B = 37.382 e^{-0.009 \times (\text{sheet thickness (μm)})}$, wherein e is the base of natural logarithm and its value is 2.7182.
The correlation coefficients were both 0.91.

TABLE 5

| Characteristic | Unit | Example 6 | Example 7 |
|---|---|---|---|
| Configuration | | Eight Stacked Sheets of Reference Example 2 | Twelve Stacked Sheets of Reference Example 2 |
| Thickness | μm | 456 | 684 |
| Electromagnetic Wave Suppression Performance 1 | % | | |
| 10 kHz B | | 0.61 | 0.08 |
| 2 GHz B | | 0.62 | 0.08 |

Comparative Examples 1 to 5

The sheets produced in Reference Examples above were stacked so as to obtain sheets having the configurations shown in Table 6. Table 6 shows the main characteristic values of the sheets obtained in this way.

TABLE 6

| Characteristic | Unit | Comparative Example 1 | Comparative Example 2 | Comparative Example 3 | Comparative Example 4 | Comparative Example 5 |
|---|---|---|---|---|---|---|
| Configuration | | Sheet of Reference Example 5 | Two Stacked Sheets of Reference Examples 1 and 5 Sheet of Reference Example 1 | Two Stacked Sheets of Reference Examples 5 and 1 Sheet of Reference Example 5 | Two Stacked Sheets of Reference Examples 2 and 5 Sheet of Reference Example 2 | Two Stacked Sheets of Reference Examples 5 and 2 Sheet of Reference Example 5 |
| Electromagnetic Wave Irradiation Side | | | | | | |
| Basis Weight | g/m² | 308.7 | 347.2 | 347.2 | 347.7 | 347.7 |
| Thickness | μm | 35 | 163 | 163 | 92 | 92 |
| Density | g/cm³ | 8.82 | 2.13 | 2.13 | 3.78 | 3.78 |

TABLE 6-continued

| Characteristic | Unit | Comparative Example 1 | Comparative Example 2 | Comparative Example 3 | Comparative Example 4 | Comparative Example 5 |
|---|---|---|---|---|---|---|
| Surface Resistivity | Ω/□ | <0.1 | $1.0 \times 10^3$ | <0.1 | $0.33 \times 10^3$ | <0.1 |
| Volume Resistivity | Ω · cm | <714 | $1.4 \times 10^5$ | <153 | $5.1 \times 10^4$ | <272 |
| Tensile Strength | kgf/15 mm | 7.0 | 8.7 | 8.7 | 11.7 | 11.7 |
| Tensile Strength | | | | | | |
| 250° C., After 1 Hour | kgf/15 mm | 6.9 | 9.0 | 9.0 | 11.7 | 11.7 |
| 300° C., After 1 Hour | | 7.1 | 9.3 | 9.3 | 11.6 | 11.6 |
| Tensile Strength Retention Rate | | | | | | |
| 250° C., After 1 Hour | % | 99 | 103 | 103 | 100 | 100 |
| 300° C., After 1 Hour | | 101 | 107 | 107 | 99 | 99 |
| Electromagnetic Wave Suppression Performance 1 | | | | | | |
| 10 kHz A | % | 99.6 | 99.4 | 99.5 | 99.4 | 99.5 |
| B | | $8.0 \times 10^{-7}$ | $4.2 \times 10^{-5}$ | $8.1 \times 10^{-7}$ | $5.2 \times 10^{-5}$ | $7.9 \times 10^{-7}$ |
| 100 − (A + B) | | 0.4 | 0.6 | 0.5 | 0.6 | 0.5 |
| 15 MHz A | | 99.6 | 99.4 | 99.5 | 99.4 | 99.5 |
| B | | $6.7 \times 10^{-7}$ | $3.8 \times 10^{-5}$ | $6.5 \times 10^{-7}$ | $4.6 \times 10^{-5}$ | $7.0 \times 10^{-7}$ |
| 100 − (A + B) | | 0.4 | 0.6 | 0.5 | 0.6 | 0.5 |
| 2 GHz A | | 99.1 | 99.0 | 99.0 | 99.0 | 99.1 |
| B | | $9.4 \times 10^{-10}$ | $4.0 \times 10^{-5}$ | $9.6 \times 10^{-10}$ | $4.9 \times 10^{-5}$ | $9.5 \times 10^{-10}$ |
| 100 − (A + B) | | 0.9 | 1.0 | 1.0 | 1.0 | 0.9 |
| C (10 kHz, A + B) | % | 99.6 | 99.4 | 99.5 | 99.4 | 99.5 |
| D (2 GHz, A + B) | % | 99.1 | 99.0 | 99.0 | 99.0 | 99.1 |
| C/D | | 1.01 | 1.00 | 1.01 | 1.00 | 1.00 |

As shown in Tables 3 to 5, the electromagnetic wave suppressing sheets of Examples 1 to 7 showed excellent characteristics in terms of electromagnetic wave absorption property, electromagnetic wave transmission suppression property, and heat resistance at a wide range of frequencies including a low frequency of 10 kH.

On the other hand, as shown in Table 6, the electromagnetic wave absorption property of the sheets of Comparative Examples 1 to 5 all showed low values and was insufficient as the intended electromagnetic wave suppression sheet.

The electromagnetic wave suppression sheet of the present invention has an electromagnetic wave absorption property which is useful as an electromagnetic wave absorbing material of electric and electronic devices and the like, particularly particularly electronic devices in hybrid cars and electric automobiles requiring weight reduction. High characteristics are exhibited without sheet backing with a metal plate, and processability and heat resistance are also high.

REFERENCE SIGNS LIST

1 electromagnetic wave suppression sheet
10 absorption layer
20 contact layer
30 opposite surface opposite to the surface to be irradiated with electromagnetic wave

What is claimed is:

1. An electromagnetic wave suppression sheet comprising:
    an absorption layer which has a surface resistivity of 100Ω/□ or more and which includes a conductive substance and an insulating material having a dielectric loss tangent of 0.01 or more at 20° C. and a frequency of 60 Hz in a state where the conductive substance and the insulating material are in direct contact with each other; and
    a contact layer which is formed on a surface opposite to a surface of the absorption layer to be irradiated with an electromagnetic wave and in which a surface in contact with the absorption layer has a surface resistivity of 20Ω/□ or more.

2. The electromagnetic wave suppression sheet according to claim 1, wherein
    the conductive substance is a carbon fiber.

3. The electromagnetic wave suppression sheet according to claim 1, wherein
    a relative permittivity of the insulating material at 20° C. and a frequency of 60 Hz is 4 or less.

4. The electromagnetic wave suppression sheet according to claim 1, wherein
    the insulating material is polymetaphenylene isophthalamide.

5. The electromagnetic wave suppression sheet according to claim 1, wherein
    a thickness of the absorption layer is ¼ or less of a wavelength of the irradiation electromagnetic wave.

6. The electromagnetic wave suppression sheet according to claim 1, satisfying the following formula (1) for electromagnetic waves having a frequency of 10 kHz and a frequency of 2 GHz $$A+B \leq 70 \tag{1}$$

wherein A is a reflectance (%) of the electromagnetic wave, and B is a transmittance (%) of the electromagnetic wave.

7. The electromagnetic wave suppression sheet according to claim 1, satisfying the following formula (2) for electromagnetic waves having a frequency of 10 kHz and a frequency of 2 GHz $$0.9 \leq C/D \leq 1.1 \tag{2}$$

wherein C is a sum of the reflectance (%) and the transmittance (%) for the electromagnetic wave having a frequency of 10 kHz, and D is a sum of the reflectance (%) and the transmittance (%) for the electromagnetic wave having a frequency of 2 GHz.

8. The electromagnetic wave suppression sheet according to claim 1, wherein a transmittance of an electromagnetic wave having a frequency of 18 GHz is 1% or less.

9. The electromagnetic wave suppression sheet according to claim 1, wherein
the electromagnetic wave suppression sheet has a thickness of 300 μm or more and 1000 μm or less.

10. The electromagnetic wave suppression sheet according to claim 1, wherein
the electromagnetic wave suppression sheet has a retention rate of a tensile strength at 300° C. for 1 hour of 90% or more.

11. The electromagnetic wave suppression sheet according to claim 1, wherein
the absorption layer is a hot pressed sheet.

12. An electrical insulator comprising the electromagnetic wave suppression sheet according to claim 1.

* * * * *